United States Patent [19]

Lenski

[11] Patent Number: 5,038,395
[45] Date of Patent: Aug. 6, 1991

[54] REFLECTOR FURNACE

[75] Inventor: Harald Lenski, Ueberlingen, Fed. Rep. of Germany

[73] Assignee: Dornier GmbH, Immenstaad, Bodensee, Fed. Rep. of Germany

[21] Appl. No.: 320,083

[22] Filed: Mar. 6, 1989

[30] Foreign Application Priority Data

Mar. 5, 1988 [DE] Fed. Rep. of Germany ....... 3807302

[51] Int. Cl.$^5$ .......................... H05B 1/00; F21V 7/00; G02B 5/10; B01S 17/22
[52] U.S. Cl. .................................. 392/420; 219/405; 219/411; 392/416; 392/421; 392/428
[58] Field of Search ............... 219/349, 347, 354, 343, 219/405, 401; 392/416, 420, 421, 428

[56] References Cited

U.S. PATENT DOCUMENTS

| 3,627,590 | 12/1971 | Mammel | 219/343 X |
| 3,761,677 | 9/1973 | Mizutani et al. | 219/354 X |
| 3,801,773 | 4/1974 | Matsumi | 219/405 |
| 3,817,710 | 6/1974 | Mizutani et al. | 219/349 X |
| 3,956,611 | 5/1976 | Nakamura | 219/349 |
| 4,184,065 | 1/1980 | Nagashima | 219/348 |

FOREIGN PATENT DOCUMENTS

| 2285517 | 7/1987 | European Pat. Off. |
| 2205558 | 10/1972 | Fed. Rep. of Germany |
| 60-86091 | 5/1985 | Japan |

Primary Examiner—Anthony Bartis

[57] ABSTRACT

A reflector surface furnace includes an open ended ellipsoidal or near ellipsoidal reflector segment having two focal areas, there being a source of radiation in the one focal area, the material to be processed being placed into the other focal area, the furnace is completed as inventive improvement by two end segments of parabolic or near parabolic configurations each having an axis of symmetry that coincides with an axis of symmetry of the central ellipsoid and interfaces with the ellipsoid in these focal areas, the two parabolical end segments have focal points which namely coincide with the focal points of the ellipsoidal segment, but for control purposes there may be separation.

4 Claims, 1 Drawing Sheet

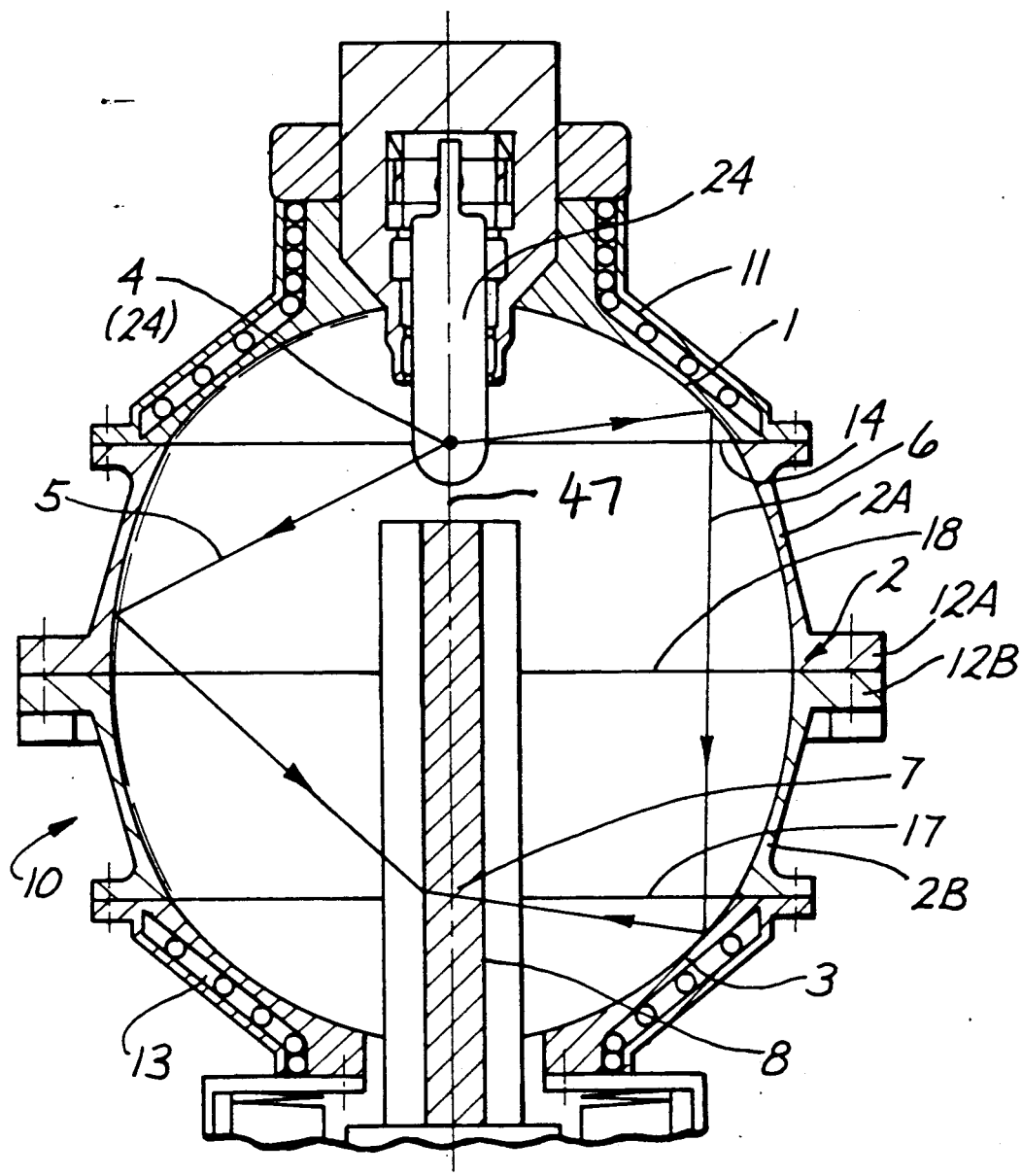

REFLECTOR FURNACE

BACKGROUND OF THE INVENTION

The present invention relates to a reflecting furnace with an ellipsoid or ellipsoidlike segment or segment portion having a first focal point in which is arranged a source of radiation and having a second focal point in which is placed the material or object to be processed.

Furnaces of the kind to which the invention pertains are usually employed for growing crystals. For example the mirror or reflecting surface furnace described in German printed patent application 22 05 558 includes two ellipsoids which heat the material to be processed from two sides. Radial symmetry obtains not in a static basis but dynamically mainly through rotation of the material and object being processed. In order to improve symmetry U.S. Pat. No. 41 84 065 describes a mirror or reflecting furnace which also includes two ellipsoids but employs an intermediate piece which separates the two ellipsoids by a particular distance. On the other hand radial symmetry is improved and still obtainable only dynamically i.e. through rotating of the object being processed.

The particular reflecting furnaces as mentioned thus far in the prior art literature are not completely those of the kind to which the invention pertains in a more stricter sense. This kind of a reflecting furnace is shown in the German patent 35 41 988 wherein particularly a modified ellipsoidal geometry is employed. Here then there is in fact a statically obtained sufficient axial and radial symmetry, provided the sample or object to be processed has the proper dimensions and is appropriately, exactly and correctly positioned. Should the axis of symmetry of the ellipsoid not coincide with the axis of the probe or sample then the heat radiation reaching the sample is no longer of radial symmetry which distorts the shape of the melting zone in an unfavorable fashion. Only if sample axis and ellipsoidal axis coincide one obtains the requisite axial asymmetry as far as the heat influx radiation is concerned so that a very limited growth length obtains.

DESCRIPTION OF THE INVENTION

It is an object of the present invention to provide a new and improved reflecting and mirror furnace such that the axial symmetry is improved and the growth length can be enlarged.

It is a specific object of the present invention to provide a new and improved reflecting furnace with an ellipsoidal segment having a first focal area that receives or contains source of radiation and having a second focal area in which is situated the object or material to be processed.

In accordance with the preferred embodiment of the present invention it is suggested to provide two parabolic, possibly modified but still near parabolic reflection end segments, respectively at the two ends of the particular furnace. The reflection end segments and a central ellipsoid have preferably a common axis. The focal areas of the paraboloids may respectively coincide with the one holding the source for radiation and the other one providing the place for the action of melting and crystal growth to take place. However, controlled displacement may yield derivable results.

Hence in accordance with the invention specifically the ends of the furnace provide two possibly modified parabolic mirror segments which redirect a portion of the radiation through twofold reflection from a source of radiation to the melting zone. The inventive mirror or reflecting surface furnace includes generally speaking a reflection surface which is composed of three surfaces, two being either exactly or approximately parabolic segments, and a third intermediate surface is exactly an approximated ellipsoidal segment.

In a first embodiment the focal point of one or both parabolic reflector end segments respectively coincides with the two focal points of the residual ellipsoid. One of these common focal points of course as stated holds the radiation source e.g. heating coil, a gas discharge path or the like. The radiation is reflected and refocussed into the second focal point of the system whereby a certain portion is reflected into the second focal point through single reflection namely through the central ellipsoid mirror while remaining radiation is twofold reflected through the twin parabolic mirror system, whereby specifically the parabola of the first parabolic end segment provides at least approximately a collimated or parallel radiation beam which then is captured by and in the second parabolic end segment and refocussed onto the sample. This way one obtains radial and axial symmetries of the total radiation as it reaches the sample and object particularly of course the area of melting. This approach in turn provides well defined conditions for the growth of the crystal. It was found in practice that the invention permits a drastic increase in drawing length and growth for similar outer dimensions of the overall mirror system. The improvement is significant as compared with comparable dimensional ellipsoid furnace of the prior art.

In addition the invention offers the capability of continuously changing the length of the melting, independent from temperature and on a continuous basis. The invention permits, in addition, refocusing of the reflected radiation either in a point or annularly-toroidally whereby the diameter of such an annulus or toroidal focal zone is equal or smaller than the diameter of the melting zone. The diameter of the focal zone moreover may be different for the two kinds of radiations namely the one which is focused once and for the radiation which is reflected twice as described above.

In a simple version of practicing the invention the focal points of ellipsoid and paraboloids coincide. From a structural point of view this is apparently quite simple. On the other hand the focal points do not have to coincide but may be separated. In accordance with the preferred embodiment one or several of the mirror or reflector segments as defined may be shiftable axially in relation to each other basically along the main axis of the mirror furnace. This adjustability permits the focal points of the parabolic and elliptical segments to make them coincide or to separate them. Hence the shape, length, configuration of the melting zone can be adjusted basically in dependence upon the degree of adjustability of the mirror segments as defined.

DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

The sole Figure is a cross section through a preferred embodiment of the present invention for practicing the best mode thereof.

Proceeding now to the detailed description of the drawing, reference numerals 1 and 3 denote parabolically configured reflecting end surface segments for a furnace 10 and being mounted respectively on support structure 11 and 13; in between them there is a two part (2A, 2B) ellipsoidal segment 2 constituting a single ellipsoid in the geometric sense, all these parts 1, 2 and 3 are of rotational symmetry; they have a common axis 47 and parts 11 and 12, and 12 and 13 are flanged together. The part 2A and 2B are respectively provided with flanges 12A and 12B which are bolted together in the interface line 18.

The ellipsoidal reflector segment 2 has two focal points 4 and 7. The illustration shows that in this case the focal point of the parabolic reflector end segment 1 coincides with the focal point 4 of the ellipsoid, while the focal point of the parabolic reflecting end segment 3 coincides with the second focal point 7 of the open ended ellipsoidal reflection segment 2. The dimensions moreover of the parabolic reflection end segments 1 and 3 are chosen so that the segments 1 and 2 are separated through a dividing plane 14 running through the focal plane 4 while the two segments 2 and 3 are separated so that there are common interface plane 17 that includes the second focal point 7 of the open ended ellipsoidal reflection segment 2. Planes 14 and 17 moreover are respectively the interfaces of the flanges of parts 11, 2A and 2B, 13.

The source of radiation 24 is situated in the focal point 4. The source 24 may be a lamp with a suitable hot area emitting thermal radiation. Reference numeral 8 refers to a carrier or object to be melted. That object may be pushed axially along the common axis 47 of the two focal points 4 and 7.

The reference numerals 5 and 6 refer to two kinds of radiations or partial radiation because the radiation portion 6 emanating back from source point 24 is intercepted and reflected by the parabolic reflector surface and segment 1 leaves the reflector as parallel beam along the main axis 47 of the system to be captured by the parabolic reflection segment 3 and refocussed end towards focal point 7. The second partial radiation 5 leaves the focal point 4 in a direction away from the interface 14 and directly towards and into the open ended ellipsoidal reflection segment 2; that radiation is reflected at the open ended ellipsoidal reflection segment 2, and by the inherent nature of such an ellipsoid is refocussed also to the focal point 7, to be effective also in the common melting zone of object 8.

The reflectors and the support structures for the several segments 1, 2 and 3 are shown to be bolted together directly. Instead bellows may be interposed and the connection may be provided by adjusting spindles. This way the focal points of the parabolic reflective end segments 1 and 3 can be separated from the points 4 and 7. If that is indeed desired it can be carried out individually, i.e. the focal point 4 may be the same for parabolic reflection segment 1 and ellipsoidal reflection segments 2 while the focal point for the segment 3 is separated from focal point 7 thereby extending the melting zone. Conceivably the gaps thus formed between the supporting element and the reflective surfaces may be bridged through cylindrical or conical reflectors.

The invention is not limited to the embodiments described above but all changes and modifications thereof, not constituting departures from the spirit and scope of the invention, are intended to be included.

I claim:

1. Reflector surface furnace including ellipsoidal open-ended reflector segment having a first focal point and a second focal point, there being a source of radiation at the first focal point, the material to be processed being placed at the second focal point, the improvement comprising, two end segments of substantially parabolic configuration respectively connected to open ends of the substantially ellipsoidal reflector segment and each having an axis of symmetry that coincides with an axis of symmetry of said ellipsoidal reflector segment, all focal points, including focal points of the end segments, being on that axis.

2. The furnace as in claim 1 wherein the two substantially parabolic end segments have focal points which respectively coincide with the focal points of the ellipsoidal segment.

3. Reflector surface furnace including substantially ellipsoidal open-ended reflector segment having a first focal point and a second focal point, there being a source of radiation at the first focal point, the material to be processed being placed at the second focal point, the improvement of two end segments of substantially parabolic configuration respectively connected to open ends of the substantially ellipsoidal segment and each with an axis of symmetry that coincides with an axis of symmetry of said ellipsoidal segment, there being two interface planes between the parabolic end segments and the ellipsoidal segment, the planes respectively coinciding with the focal points of the ellipsoidal segment, all the focal points, including focal points of the end segments, being on said axis of symmetry.

4. Furnace as in claim 3 wherein the two substantially parabolic end segments have their focal points respectively coinciding with the focal points of the ellipsoidal segment.

* * * * *